US011629985B2

(12) United States Patent
Pan et al.

(10) Patent No.: US 11,629,985 B2
(45) Date of Patent: Apr. 18, 2023

(54) METHOD FOR REGULATING INERT GAS FLOW, METHOD FOR PREPARING MONOCRYSTALLINE SILICON, AND MONOCRYSTALLINE SILICON

(71) Applicants: XI'AN ESWIN MATERIAL TECHNOLOGY CO., LTD., Xi'an (CN); XI'AN ESWIN SILICON WAFER TECHNOLOGY CO., LTD., Xi'an (CN)

(72) Inventors: Hao Pan, Xi'an (CN); Hyunguk Jeon, Xi'an (CN)

(73) Assignees: XI'AN ESWIN MATERIAL TECHNOLOGY CO., LTD., Xi'an (CN); XI'AN ESWIN SILICON WAFER TECHNOLOGY CO., LTD., Xi'an (CN)

( * ) Notice: Subject to any disclaimer, the term of this patent is extended or adjusted under 35 U.S.C. 154(b) by 342 days.

(21) Appl. No.: 16/912,885

(22) Filed: Jun. 26, 2020

(65) Prior Publication Data
US 2020/0408582 A1 Dec. 31, 2020

(30) Foreign Application Priority Data

Jun. 26, 2019 (CN) .......................... 201910561681.1

(51) Int. Cl.
| *C30B 15/00* | (2006.01) |
| *G01F 3/22* | (2006.01) |
| *F26B 21/00* | (2006.01) |
| *C30B 27/02* | (2006.01) |
| *C30B 29/06* | (2006.01) |
| *F26B 21/02* | (2006.01) |

(52) U.S. Cl.
CPC ................ *G01F 3/22* (2013.01); *C30B 15/00* (2013.01); *C30B 27/02* (2013.01); *C30B 29/06* (2013.01); *F26B 21/003* (2013.01); *F26B 21/022* (2013.01)

(58) Field of Classification Search
CPC ......... C30B 15/00; C30B 27/02; C30B 29/06; G01F 3/22; Y10T 117/1032
See application file for complete search history.

(56) References Cited

U.S. PATENT DOCUMENTS

2020/0027732 A1  1/2020  Ogawa et al.

FOREIGN PATENT DOCUMENTS

| CN | 104213185 A | 12/2014 |
| CN | 104562184 A | 4/2015 |
| CN | 107604431 A | 1/2018 |

(Continued)

OTHER PUBLICATIONS

Chinese IPO Office Action in related case CN 201910561681.1.

*Primary Examiner* — Robert M Kunemund
(74) *Attorney, Agent, or Firm* — Maginot, Moore & Beck LLP

(57) ABSTRACT

The present disclosure provides a method for regulating an inert gas flow in a crystal pulling furnace, a method for preparing monocrystalline silicon, and monocrystalline silicon. The method for regulating an inert gas flow includes introducing the inert gas into a main furnace chamber of the crystal pulling furnace from an auxiliary furnace chamber of the crystal pulling furnace, and regulating a flow direction of the inert gas flow introduced into the auxiliary furnace chamber of the crystal pulling furnace.

12 Claims, 9 Drawing Sheets

(56) References Cited

FOREIGN PATENT DOCUMENTS

| | | | |
|---|---|---|---|
| EP | WO 2006/040878 | * | 8/2005 |
| JP | 3838013 | * | 11/2006 |
| JP | 2014-43375 | * | 3/2014 |
| WO | 2018154874 A1 | | 8/2018 |

* cited by examiner

METHOD FOR REGULATING INERT GAS FLOW, METHOD FOR PREPARING MONOCRYSTALLINE SILICON, AND MONOCRYSTALLINE SILICON

CROSS-REFERENCE TO RELATED APPLICATION

This application claims priority under 35 U.S.C. § 119 to Chinese Patent Application No. 201910561681.1 filed on Jun. 26, 2019, the disclosure of which is incorporated herein by reference in its entirety.

TECHNICAL FIELD

The disclosure relates to the technical field of preparing semiconductor, in particular to a method for regulating an inert gas flow, a method for preparing monocrystalline silicon, and the prepared monocrystalline silicon.

BACKGROUND

The magnetic field applied Czochralski method (MCZ) is currently one of the most common crystal pulling method, which is popular because it suppresses the thermal convection of the molten polysilicon during crystal growth and also act as a manner for reducing oxygen in monocrystalline silicon rods.

In the prior art, monocrystalline silicon rod is prepared using a crystal pulling furnace. The polycrystalline silicon raw material is melted in a quartz crucible within the crystal pulling furnace. When the polycrystalline silicon raw material is melted, the quartz crucible will have a reaction as follows: $SiO_2(s) \rightarrow Si(l)+2O$. The oxygen atoms generated from the wall of the quartz crucible are evenly distributed in the silicon solution by the stirring effect of natural convection. Some of the oxygen atoms present on the surface of the silicon solution will react as follows: $Si(l)+O \rightarrow SiO(g)$, and will be volatilized in the form of silicon monoxide (SiO). In order to control the impurities in the crystal pulling furnace, it is necessary to evacuate the furnace and introduce argon gas. As a protective gas, argon gas is fed into from above the auxiliary furnace chamber. A device such as a reflector is provided in the main furnace chamber, to adjust the flow direction and speed of argon gas and to improve the oxide transport direction in the crystal pulling furnace. However, when argon gas is introduced into the auxiliary furnace chamber of the crystal pulling furnace, since the speed of argon gas in the furnace ranges from 0.9 m/s to 8.0 m/s, there is more turbulence in the auxiliary furnace chamber as a whole. In the early stage of pulling monocrystalline silicon rods, the long pulling rope is easy to cause shaking. This is not conducive to the stability of contact surface for growing crystals, and it is very easy to cause crystal dislocation presented in the final crystals. Thus the number of remelting of the crystal rods is increased and the cost for growing the crystals is also increased. Moreover, the traditional draft tube will also cause more turbulence in the main furnace chamber. This is not conducive to the discharge of impurities, thereby causing the impurities to sticking to the sidewalls of the thermal field components.

SUMMARY

In view of this, the present disclosure provides a method for regulating an inert gas flow in the crystal pulling furnace, which can regulate flow direction of the inert gas introduced into the auxiliary furnace by installing the gas flow stabilizing device in the auxiliary furnace chamber of the crystal pulling furnace. The method according to the present disclosure solves the following problems that the monocrystalline silicon rod is prone to shake in the early stage of growth due to more gas turbulence in the auxiliary furnace, that the contact between the growing crystal interface and the melt liquid surface is unstable, and that the crystal is prone to exist dislocation.

In order to solve the above technical problems, the present disclosure provides a method for regulating an inert gas flow in the crystal pulling furnace.

According to the embodiment of the first aspect of the present disclosure, the method for regulating an inert gas flow is provided which is applied to a crystal pulling furnace, and the method includes: introducing the inert gas into a main furnace chamber of the crystal pulling furnace from an auxiliary furnace chamber of the crystal pulling furnace, and regulating a flow direction of the inert gas flow introduced into the auxiliary furnace chamber of the crystal pulling furnace.

Preferably, the method for regulating the inert gas flow further includes: rectifying the inert gas flow in the auxiliary furnace chamber; and evenly distributing the inert gas flow after the rectifying.

Preferably, the method for regulating the inert gas flow further includes: rectifying the inert gas flow again after the distributing; and distributing the inert gas flow again after the rectifying again.

Preferably, in the method for regulating the inert gas flow further includes: adjusting a size of a steady inert gas flow interval formed between the rectifying and the distributing to adjust a flow direction and a flow rate of the inert gas flow to be introduced into a main furnace chamber.

Preferably, the method for regulating the inert gas flow further includes: controlling a position of the inert gas flow where the inert gas flow is distributed in the auxiliary furnace chamber to adapt for growth of crystal rods at different lengths.

According to an embodiment of the second aspect of the present disclosure, the method for preparing the monocrystalline silicon is provided, which is applied to a crystal pulling furnace including a main furnace chamber and an auxiliary furnace chamber, and the method including: melting polycrystalline silicon in the main furnace chamber of the crystal pulling furnace; contacting a seed crystal with the molten polycrystalline silicon; and introducing an inert gas flow into the auxiliary furnace chamber of the crystal pulling furnace, and regulating the inert gas flow by the method of any of the above embodiments.

Preferably, the method for preparing the monocrystalline silicon further includes: adjusting a size of the steady flow interval formed between the rectifying and the distributing to adjust a flow direction and a flow rate of the inert gas flow to be introduced into a main furnace chamber, after the polycrystalline silicon has completely been melted, and when the seed crystal contacts with the molten polycrystalline silicon, and a growing crystal rod does not reach a bottom of the auxiliary furnace chamber.

Preferably, the method for preparing the monocrystalline silicon further includes: controlling a position of the inert gas flow where the inert gas flow is distributed in the auxiliary furnace chamber to adapt for growth of crystal rods at different lengths.

Preferably, the method further includes: guiding the inert gas flow by a reflector provided in the main furnace chamber of the crystal pulling furnace when the inert gas flow is introduced into the main furnace chamber, so that the inert gas flows toward a contact interface between the molten polycrystalline silicon and the seed crystal.

According to the embodiment of the third aspect of the present disclosure, the monocrystalline silicon is obtained by the method for preparing monocrystalline silicon as described in the above embodiment.

The advantageous effects of the above technical solutions according to the embodiments of the present disclosure are shown as follows.

1) The method for regulating the inert gas flow according to the embodiment of the present disclosure can regulate the flow direction of the inert gas flow introduced into the auxiliary furnace chamber of the crystal pulling furnace, to reduce the turbulent intensity of the inert gas inside the auxiliary furnace chamber of the crystal pulling furnace and form a stable gas flow. Moreover, the swing of the monocrystalline silicon rod caused by the gas flow is reduced by constraining the flow direction of the inert gas. Thus, the method according to the embodiments of the present disclosure is conducive to contact stably between the monocrystalline silicon rod and the molten liquid surface, and to reduce the probability of monocrystalline growth dislocations. At the same time, the impurities in the main furnace chamber carried to the auxiliary furnace chamber by turbulent flow are reduced, and accordingly pollution and erosion to the sidewalls of the crystal rods and thermal field components are also reduced.

2) The adjustment of the steady flow interval through the spacing between the rectifying and the distributing can improve the monocrystalline growth environment in the main furnace chamber, suppress the occurrence of turbulent flow, and reduce the chance of crystal remelting.

3) It is suited for growing crystal rods at different lengths.

Figure 1A:
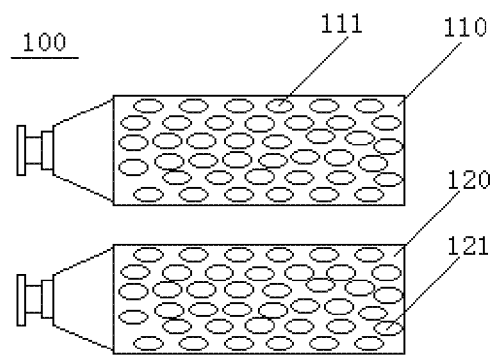
FIG. 1a is a front view showing a structure of a flow stabilizing device according to the present disclosure.
Figure 1B:
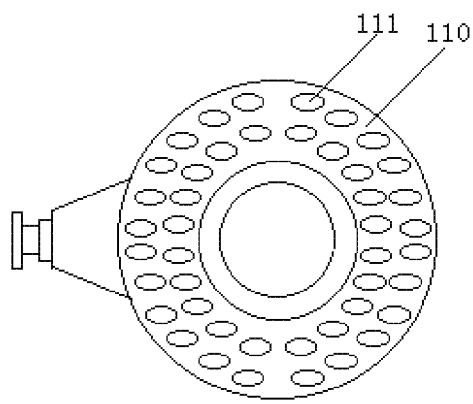
FIG. 1b is a top view showing the flow stabilizing device in FIG. 1.

REFERENCE NUMBERS flow stabilizing device 100;
first flow stabilizing hood 110; first via hole 111;
second flow stabilizing hood 120; second via hole 121;
spacing adjustment mechanism 130; spacing adjustment bracket 131;
first driving mechanism 132; transmission component 133;
position adjustment mechanism 140;
crystal pulling furnace 200;
furnace body 210; main furnace chamber 211;
auxiliary furnace chamber 212; reflector 213;
inert gas 300;
impurity 400.

DETAILED DESCRIPTION

In order to illustrate the purposes, technical solution and advantages in the embodiments of the present disclosure in a clearer manner, the technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on the described embodiments of the present disclosure, a person skilled in the art may obtain the other embodiments, which also fall within the scope of the present disclosure.

The flow stabilizing device 100 according to an embodiment of the present disclosure will be specifically described hereafter first in conjunction with the drawings.

As shown in FIG. 1a to FIG. 5, the flow stabilizing device 100 according to an embodiment of the present disclosure is applied to a crystal pulling furnace 200 and includes a first flow stabilizing hood 110 and a second flow stabilizing hood 120.

Specifically, the first flow stabilizing hood 110 is provided with a plurality of first via holes 111. The first flow stabilizing hood 110 is configured to be installed in the auxiliary furnace chamber 212 of the crystal pulling furnace 200, to regulate the flow direction of inert gas 300 introducing into the crystal pulling furnace 200. The second flow stabilizing hood 120 is provided with a plurality of second via holes 121. The second flow stabilizing hood 120 is configured to be installed in the auxiliary furnace chamber 212 of the crystal pulling furnace 200 and arranged to be opposite to the first flow stabilizing hood 110, to regulate the flow direction of inert gas 300 regulated by the first flow stabilizing hood 110.

That is to say, when the inert gas 300 is introduced into the auxiliary furnace chamber 212 of the crystal pulling furnace 200, the inert gas 300 first passes through the first via hole 111 of the first flow stabilizing hood 110, and the flow direction of the inert gas flow is regulated from the original turbulent flow into a vertical downward flow direction, thereby relieving the turbulence of the gas flow of the inert gas 300. Then the inert gas flow flows out from the second via hole 121 of the second flow stabilizing hood 120 and is regulated into a more stable and ordered inert gas flow. When the stable gas flow after being regulated flows through the surface of the monocrystalline silicon rod in the main furnace chamber 211, the swing amplitude of the monocrystalline silicon rod due to the gas flow can be reduced. This can help to stably contact between the monocrystalline silicon rod and the molten liquid surface, reduce the probability that growth dislocations occur in the growing monocrystalline silicon rod, and improve the production efficiency of monocrystalline silicon rods. At the same time, due to the uniform and stable flow of the inert gas flow, the impurities 400 in the main furnace chamber 211 carried by the turbulent flow to the auxiliary furnace chamber 212 can be reduced. This facilitates the discharge of the impurities 400 and avoids the problems such as pollution and erosion caused by the impurities 400 to the sidewalls of the crystal rods and the thermal field components.

Therefore, the flow stabilizing device 100 according to the embodiment of the present disclosure can regulate the flow direction of the inert gas 300 introducing into the auxiliary furnace chamber 212 of the crystal pulling furnace 200, to make the inert gas flow direction is more orderly. Thus it can reduce the turbulent intensity of the inert gas 300 inside the auxiliary furnace chamber 212 of the crystal pulling furnace 200, and constrain the flow direction of the inert gas 300. Further, it can reduce the swing of the monocrystalline silicon rod caused by the inert gas flow, help to stably contact between the monocrystalline silicon rod and the molten liquid surface. Still further, it can reduce the probability that growth dislocations occur in the growing monocrystalline silicon rod, and improve the production efficiency of the monocrystalline silicon rod. Yet still further it can reduce the impurities 400 in the main furnace chamber 211 carried to the auxiliary furnace chamber 212 by turbulent flow, and avoid the problems as pollution and erosion caused by the impurities 400 to the sidewalls of the crystal rods and thermal field components.

Figure 1C:
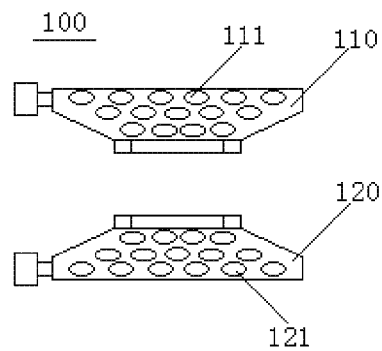
FIG. 1c is a front view showing another structure of the flow stabilizing device according to the present disclosure.
Figure 1D:
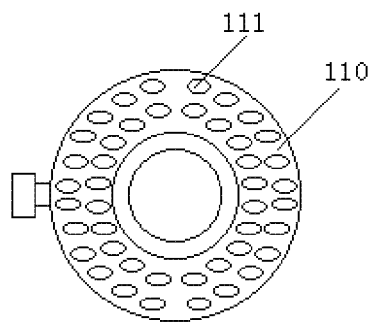
FIG. 1d is a top view showing the flow stabilizing device in FIG. 1c.
Figure 4:
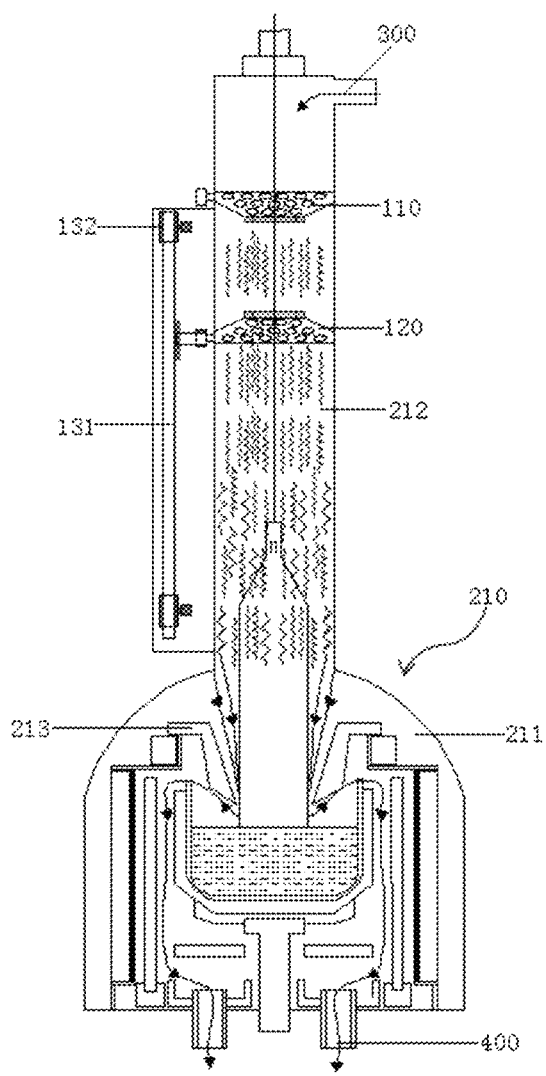
FIG. 4 is a diagram showing a state of gas flow in a crystal pulling furnace according to the present disclosure.
Figure 5:
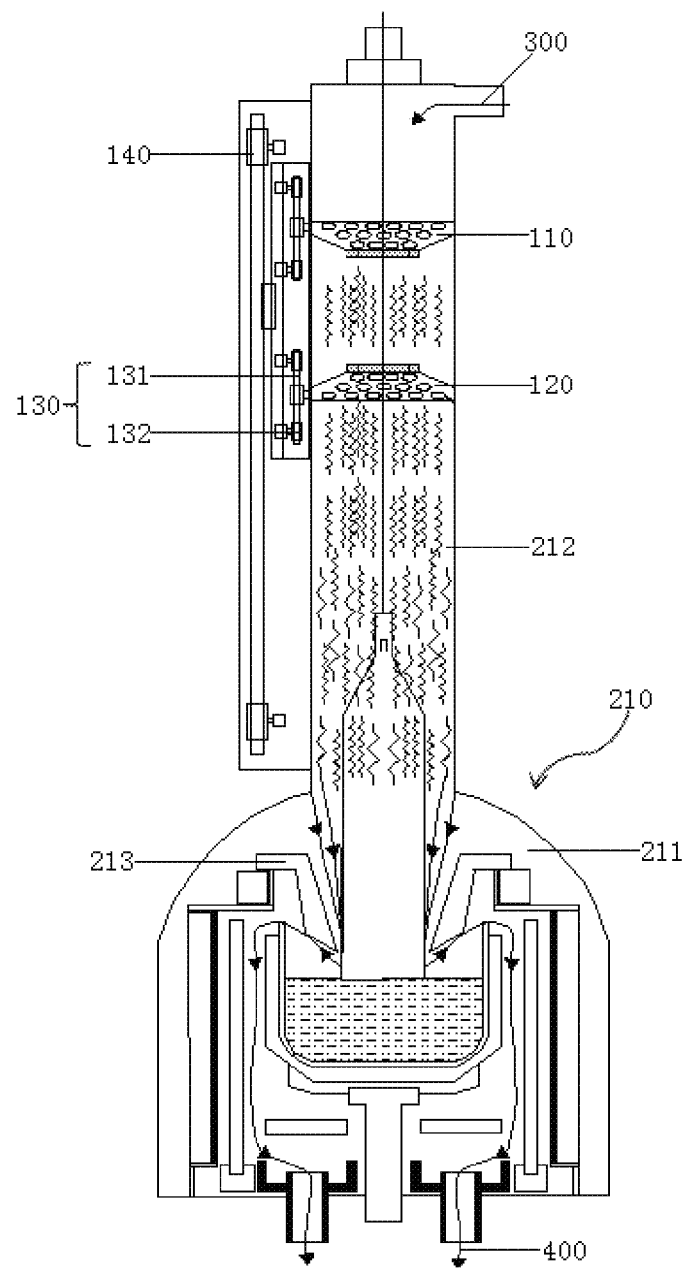
FIG. 5 is a diagram showing a state of gas flow in another crystal pulling furnace according to the present disclosure.

Preferably, as shown in FIGS. 1c, 4 and 5, the first flow stabilizing hood 110 is formed as a funnel with a wide mouth at one end and a narrow mouth at the other end. The first flow stabilizing hood 110 is used to rectify the inert gas 300 passing into the crystal pulling furnace 200. The inert gas 300 flows in from the wide mouth end of the first flow stabilizing hood 110 and flows out from the narrow mouth end. The second flow stabilizing hood 120 is formed as a funnel with a wide mouth at one end and a narrow mouth at the other end. The narrow mouth end of the flow stabilizing hood 120 is arranged to be opposite to the narrow mouth end of the first flow stabilizing hood 110. The second flow stabilizing hood 120 is used to evenly distribute the rectified inert gas 300.

That is to say, both the first flow stabilizing hood 110 and the second flow stabilizing hood 120 are funnel, that is, one end has a wide mouth and the other end has a narrow mouth. The narrow mouth end of the first flow stabilizing hood 110 is arranged to be adjacent to the narrow mouth end of the second flow stabilizing hood 120. During stabilizing the inert gas flow, after the inert gas 300 passes through the first via hole 111, that is, the inert gas flow flows in from the narrow mouth end of the second flow stabilizing hood 120 and flows out from the wide mouth end, the flow direction is regulated and rectified to reduce the turbulence of the inert gas flow of the inert gas 300. Then the inert gas flow flows in from the narrow mouth end of the second flow stabilizing hood 120 and flows out from the wide mouth end. After the rectified inert gas flow is evenly distributed by the second via hole 121, a more stable and ordered inert gas flow is formed. This can further reduces the swing amplitude of the monocrystalline silicon rod due to the inert gas flow, reduce the probability of occurrence of monocrystalline growth dislocations. Further it can improve the production efficiency of monocrystalline silicon rods, and is more conducive to the discharge of impurities 400 and better protecting the crystal rods and thermal field components.

The shapes of the first flow stabilizing hood 110 and the second flow stabilizing hood 120 in the present disclosure are not limited thereto. In other embodiments of the present disclosure, other shapes of the flow stabilizing hood, such as a cone, may also be used. The design is based on the shape of the auxiliary furnace chamber 212 of the crystal pulling furnace, and the shapes of the first flow stabilizing hood 110 and the second flow stabilizing hood 120 may also be different.

The inert gas 300 in the present disclosure may be preferably argon gas, and argon gas has better stability as a protective gas.

According to an embodiment of the present disclosure, the flow stabilizing device 100 further includes a spacing adjustment mechanism 130 for adjusting the distance between the first flow stabilization hood 110 and the second flow stabilization hood 120 to expand the steady flow interval.

In other words, the first flow stabilizing hood 110 and the second flow stabilizing hood 120 are connected by a spacing adjustment mechanism 130, and the spacing adjustment mechanism 130 can adjust the distance between the first flow stabilizing hood 110 and the second flow stabilizing hood 120. The inert air flow passing through the first flow stabilizing hood 110 flows to the second flow stabilizing hood 120 through a relatively long steady flow interval. This will further stabilize the flow rate of the inert gas, allow the inert air flow passing through the second flow stabilizing hood 120 to be more stable and orderly. Thus the growth environment of monocrystalline silicon rods in the main furnace chamber 211 will be further improved.

Preferably, the spacing adjustment mechanism 130 includes a spacing adjustment bracket 131 and a first driving mechanism 132, and the spacing adjustment bracket 131 is connected to the first flow stabilizing hood 110 and the second flow stabilizing hood 120, respectively. Alternatively, the spacing adjustment bracket 131 is connected to the first flow stabilizing hood 110 or the second flow stabilizing hood, and the first driving mechanism 132 is connected to the spacing adjustment bracket 131 for driving the spacing adjustment bracket 131, so that the spacing adjustment bracket 131 drives the first flow stabilizing hood 110 and the second flow stabilizing hood 120 to move closer to or away from each other.

In other words, the first flow stabilizing hood 110 and the second flow stabilizing hood 120 may be respectively connected to the spacing adjustment bracket 131. Alternatively, the first flow stabilizing hood 110 may be connected to the spacing adjustment bracket, or the second flow stabilizing hood 120 may be connected to the spacing adjustment bracket 131. When the spacing adjustment bracket 131 is connected to the first flow stabilizing hood 110 and the second flow stabilizing hood 120, the first driving mechanism 132 can drive the spacing adjustment bracket 131 to move the first flow stabilizing hood 110 and the second flow stabilizing hood 120 closer to or away from each other, thereby adjusting the distance between the first flow stabilizing hood 110 and the second flow stabilizing hood 120. This distance can effectively improve the flow stabilization effect of the inert gas flow, and adjust the direction again after the inert gas flow passes through the spacing, which not only is convenient to control the flow rate, but also can better adjust the flow direction of the airflow. Alternatively, the spacing adjustment bracket 131 is connected to the first flow stabilizing hood 110, and the second flow stabilizing hood 120 is fixed; or the first flow stabilizing hood 110 is fixed, and the spacing adjustment bracket 131 is connected to the second flow stabilizing hood 120. The spacing between the flow stabilizing hood 110 and the second flow stabilizing hood 120 is adjusted by driving the first flow stabilizing hood 110 or the second flow stabilizing hood 120.

Preferably, the first driving mechanism 132 and the spacing adjustment bracket 131 are connected through a transmission component 133, and the transmission component 133 includes a transmission belt or a transmission chain.

As shown in FIGS. 3a to 3d, the first driving mechanism 132 and the spacing adjustment bracket 131 may be connected by a transmission belt or a transmission chain. The transmission belt may be a transmission method of a gear and a conveyor belt, or a transmission method of a transmission chain and a gear. The structure has a better transmission effect, and the movement is relatively stable. Of course, in other embodiments of the present disclosure, other structures may also be adopted to realize the first driving mechanism 132 to drive the spacing adjustment bracket 131 to move, so that the first driving mechanism 132 drives the first flow stabilizing hood 110 or the second flow stabilizing hood 120 to move, in which the first driving mechanism 132 may use a motor. A driving manner such as a cylinder may also be used, which is not limited herein.

According to another embodiment of the present disclosure, the flow stabilizing device 100 further includes a position adjustment mechanism 140, connected to the spacing adjustment mechanism 130 for driving the spacing adjustment mechanism 130 to move, to adjust the position of the first flow stabilizing hood 110 and the second flow stabilizing hood 120 in the auxiliary furnace chamber 212 of the crystal pulling furnace 200.

As shown in FIG. 5, the position adjustment mechanism 140 is connected to the spacing adjustment mechanism 130. The position adjustment mechanism 140 can drive the spacing adjustment mechanism 130 to move up and down, to adjust the position of the first flow stabilizing hood 110 and the second flow stabilizing hood 120 in the auxiliary furnace chamber 212 in the crystal pulling furnace, which allows the crystal pulling furnace to adopt for growing crystal rods at different lengths, and improve the use flexibility of the crystal pulling furnace.

Preferably, the position adjustment mechanism 140 and the spacing adjustment mechanism 130 may also be connected by a transmission component 133. The specific structure can be referred to the transmission component 133 of the foregoing embodiments, and are not described herein again.

According to some embodiments of the present disclosure, each first flow stabilizing hood 110 and each second flow stabilizing hood 120 are in a group, and the flow stabilizing device 100 includes a plurality of groups of the first flow stabilizing hood 110 and the second flow stabilizing hood 120.

Figure 1E:
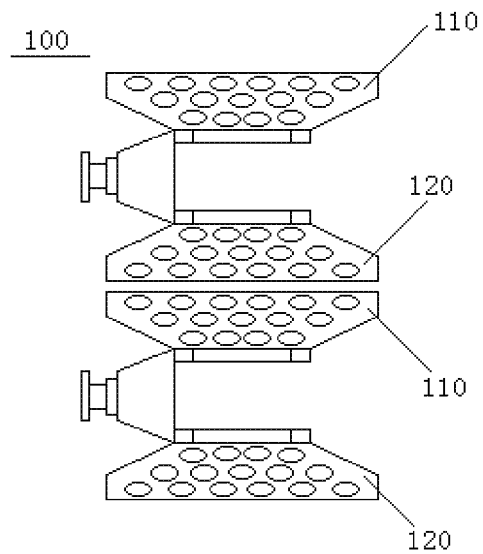
FIG. 1e is a front view showing a yet structure of the flow stabilizing device according to the present disclosure.
Figure 1F:
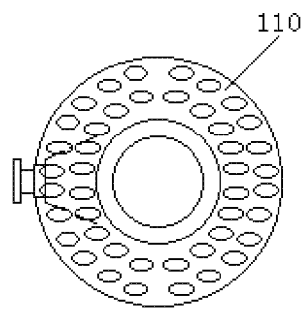
FIG. 1f is a top view showing the flow stabilizing device in FIG. 1e.
Figure 1G:
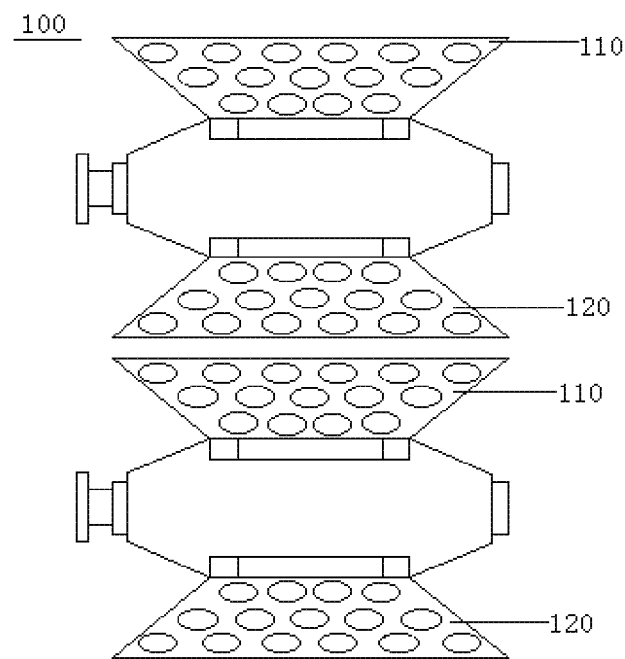
FIG. 1g is a front view showing a structure of a flow stabilizing device according to the present disclosure.
Figure 2A:
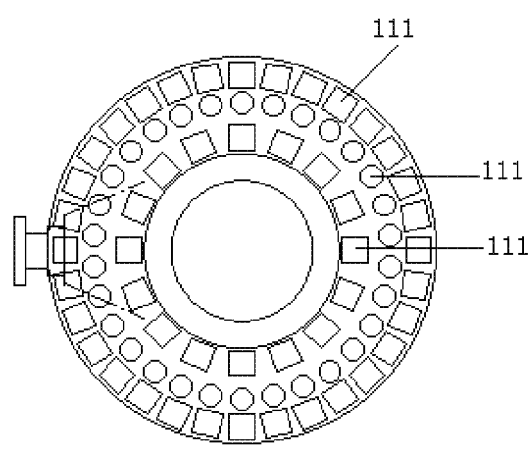
FIG. 2a is a schematic view showing structures of a first flow stabilizing hood and a second flow stabilizing hood according to the present disclosure.
Figure 2B:
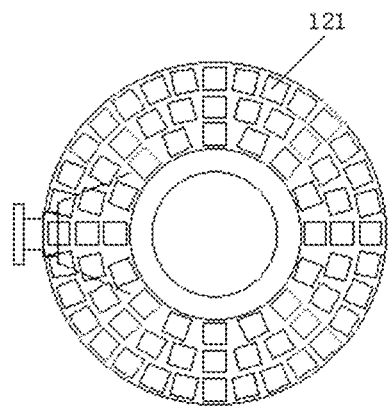
FIG. 2b is a schematic view showing another embodiment of structures of a first flow stabilizing hood and a second flow stabilizing hood according to the present disclosure.
Figure 2C:
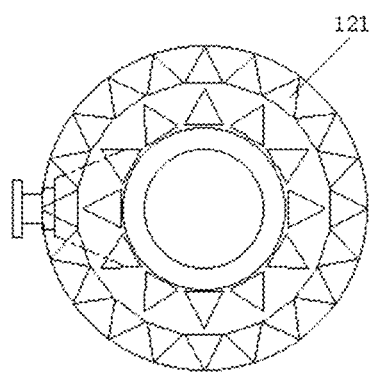
FIG. 2c is a schematic view showing yet another embodiment of structures of a first flow stabilizing hood and a second flow stabilizing hood according to the present disclosure.
Figure 2D:
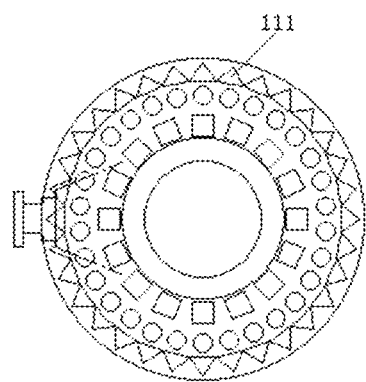
FIG. 2d is a schematic view showing yet another embodiment of structures of a first flow stabilizing hood and a second flow stabilizing hood according to the present disclosure.
Figure 2E:
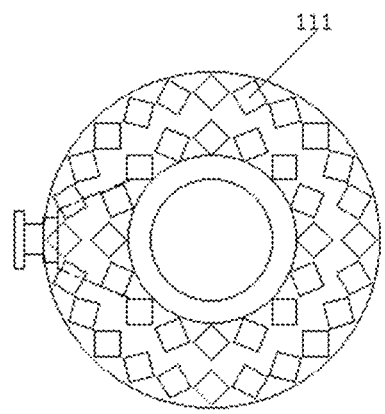
FIG. 2e is a schematic view showing yet another embodiment of structures of a first flow stabilizing hood and a second flow stabilizing hood according to the present disclosure.
Figure 2F:
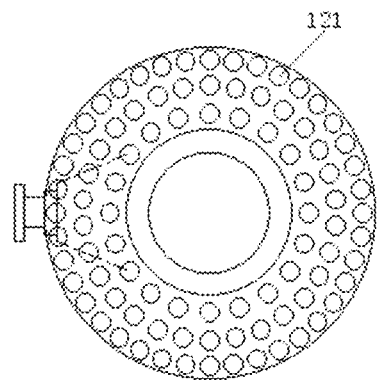
FIG. 2f is a schematic showing yet another embodiment of structures of a first flow stabilizing hood and a second flow stabilizing hood according to the present disclosure.
Figure 2G:
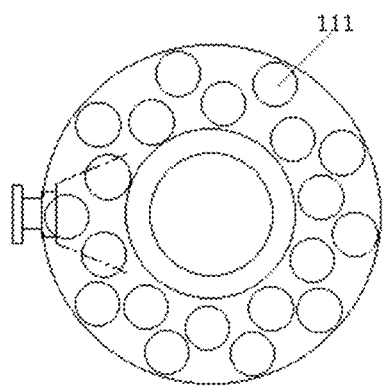
FIG. 2g is a schematic showing yet another embodiment of structures of a first flow stabilizing hood and a second flow stabilizing hood according to the present disclosure.
Figure 2H:
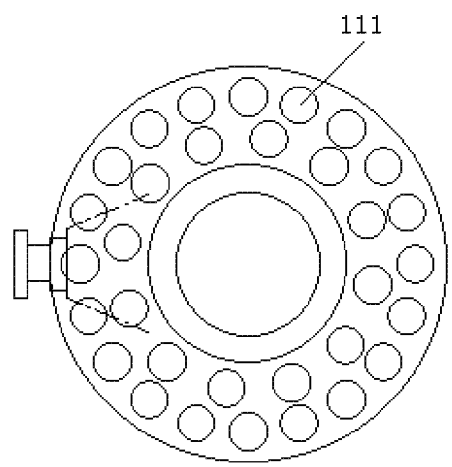
FIG. 2h is a schematic view showing yet another embodiment of structures of a first flow stabilizing hood and a second flow stabilizing hood according to the present disclosure.
Figure 2I:
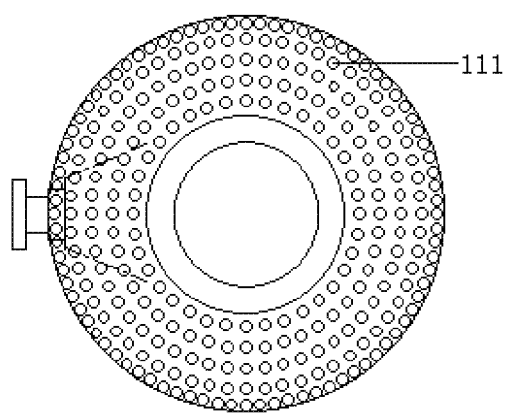
FIG. 2i is a schematic showing yet another embodiment of structures of a first flow stabilizing hood and a second flow stabilizing hood according to the present disclosure.
Figure 3A:
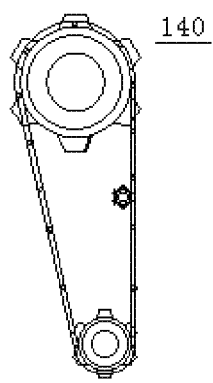
FIG. 3a is a schematic showing a structure of a transmission component according to the present disclosure.
Figure 3B:
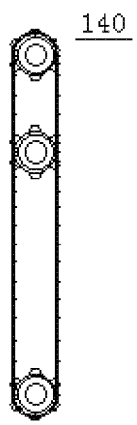
FIG. 3b is a schematic showing another structure of a transmission component according to the present disclosure.
Figure 3C:
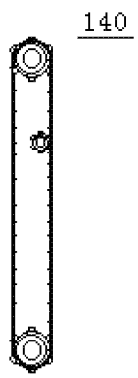
FIG. 3c is a schematic showing yet another structure of a transmission component according to the present disclosure.
Figure 3D:
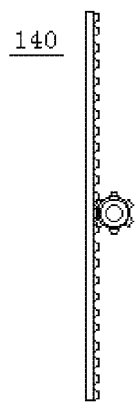
FIG. 3d is a schematic showing yet another structure of a transmission component according to the present disclosure.

As shown in FIGS. 1e to 1g, the flow stabilizing device 100 includes a combination of a plurality of groups of the first flow stabilizing hood 110 and the second flow stabilizing hood 120. That is, a combination of one group of the first flow stabilizing hood 110 and the second flow stabilizing hood 120 or a combination of more groups of the first flow stabilizing hood 110 and the second flow stabilizing hood 120 can be arranged in the auxiliary furnace chamber of the crystal pulling furnace according to actual conditions. In this way, the flow direction and flow rate of the inert gas 300 in the auxiliary furnace chamber 212 of the crystal pulling furnace are better adjusted in appropriate circumstances, thereby further improving the use flexibility of the flow stabilizing device 100.

Optionally, the first flow stabilizing hood 110 and the second flow stabilizing hood have aperture ratios of 120 are 80% to 95%. That is to say, the aperture ratios of the first flow stabilizing hood 110 and the second flow stabilizing hood 120 can be controlled between 80% and 95%. The aperture ratios with the above range can better control the flow rate and distribution uniformity of the inert gas 300, so as to ensure a smooth and orderly flow of inert gas. The aperture ratio of the first flow stabilizing hood 110 is a percentage of the sum of the cross-sectional areas of all the first via holes 111 on the first flow stabilizing hood 110 accounting for the surface area of the outer peripheral wall of the first flow stabilizing hood 110, and the aperture ratio of the second flow stabilizing hood 120 is a percentage of the sum of the cross-sectional areas of all the second via holes 121 on the second flow stabilizing hood 120 accounting for the surface area of the outer peripheral wall of the second flow stabilizing hood 120.

Further, the cross sections of the first via hole 111 and the second via hole 211 are circular, square, triangular, or a mixture thereof.

As shown in FIGS. 2a to 2e, the shapes of the cross-sections of the first via hole 111 and the second via hole 211 can be set according to the actual situation, and different shapes and sizes will affect the aperture ratio. Therefore, according to the actual situation, round, triangular, square or other shapes can be chosen, or a mixture of several shapes can also be chosen to ensure that the aperture ratio is controlled between 80% and 95%. The shape of the cross section of the hole is not limited herein.

In a preferred embodiment of the present disclosure, the cross sections of the first via hole 111 and the second via hole 211 are circular, and the pore sizes of the first via hole 111 and the second via hole 211 are between 5 mm and 20 mm. That is to say, the pore size in the present disclosure is preferably limited to a certain range as described above, and the aperture ratio can be ensured by controlling the pore size. Preferably, when the cross sections of the first via hole 111 and the second via hole 211 are round shape, the pore size range is controlled between 5 mm and 20 mm, to better control the flow direction and flow rate of the inert air flow. Of course, in other embodiments of the present disclosure, the cross-sectional shapes and pore sizes of the first via hole 111 and the second via hole 120 can also be appropriately adjusted according to the surface areas of the first flow stabilizing hoods 110 and the second flow stabilizing hoods 120, and are not limited here.

In summary, according to the flow stabilizing device 100 of the embodiment of the present disclosure, the flow direction of the inert gas 300 passing into the auxiliary furnace chamber 212 of the crystal pulling furnace 200 can be regulated, so that the inert gas flow direction is more orderly, the turbulent intensity of the inert gas 300 inside the auxiliary furnace chamber 212 is reduced, and the flow direction of the inert gas 300 is constrained so as to reduce the swing of the monocrystalline silicon rod caused by the gas flow. This helps to stably contact between the monocrystalline silicon rod and the molten liquid surface, to reduce the probability of monocrystalline growth dislocations, to improves the production efficiency of the monocrystalline silicon rod, to reduce the impurities 400 in the main furnace chamber 211 carried to the auxiliary furnace chamber 212 by turbulent flow, and to avoid the problems as pollution and erosion caused by the impurities 400 to the sidewalls of the crystal rods and thermal field components. At the same time, the distance between the first flow stabilizing hood 110 and the second flow stabilizing hood 120 can further adjust the flow rate of the inert air flow and ensure the stability of the inert air flow. The position of the first flow stabilizing hood 110 and the second flow stabilizing hood 120 in the auxiliary furnace chamber 212 can be adjusted to adapt for growing crystal rods at different lengths, thereby improving the use flexibility of the flow stabilizing device 100.

As shown in FIGS. 1 and 5, a crystal pulling furnace 200 according to an embodiment of the present disclosure includes a furnace body 210, and the furnace body 210 includes a main furnace chamber 211 and an auxiliary furnace chamber 212 communicating with the main furnace chamber 211. The auxiliary furnace chamber 212 is provided with the flow stabilizing device 100 as mentioned in the above embodiments.

In other words, the flow stabilizing device 100 is installed in the auxiliary furnace chamber 212 of the crystal pulling furnace 200. During the flow stabilization, the inert gas 300 flows in from the upper end of the auxiliary furnace chamber 212, and then passes through the first flow stabilizing hood 110, the second flow stabilizing flow hood 120, and the reflector 213 of the main furnace chamber 211 in sequence. After passing through the first flow stabilizing hood 110 and the second flow stabilizing hood 120, the flow direction of the inert gas 300 are changed, so that the inert air flow is more orderly. After the inert gas 300 with the changed direction enters the main furnace chamber 211, the flow of the inert air is smooth and orderly, thereby reducing the turbulence of the airflow of the inert gas 300. When the inert air flow passes through the reflector 213 of the main furnace chamber 211 and flows to the surface of the monocrystalline silicon rod, the swing amplitude of the monocrystalline silicon rod due to the inert air flow can be reduced, which can help the stable contact between the monocrystalline silicon rod and the molten liquid surface, reduce the probability that growth dislocations occur in the monocrystalline silicon rod. Thus it can improve the production efficiency of monocrystalline silicon rods, reduce the impurities 400 in the main furnace chamber 211 carried to the auxiliary furnace chamber 212 by turbulent flow. Further it is conducive to the impure material 400 being discharged from the main furnace chamber in time, and avoids the problems as pollution and erosion caused by the impurities 400 to the sidewalls of the crystal rods and thermal field components.

Preferably, the flow stabilizing device 100 further includes a spacing adjustment mechanism 130 for adjusting the distance between the first flow stabilization hood 110 and the second flow stabilization hood 120 to expand the steady flow interval. One end of the first flow stabilization hood 110 and the second flow stabilization hood 120 passes through the furnace body of the auxiliary furnace chamber 212, and another end of the first flow stabilization hood 110 and/or the second flow stabilizing hood 120 is connected to the spacing adjustment mechanism 130.

One end of the first flow stabilizing hood 110 and the second flow stabilizing hood 120 may pass through the furnace wall of the auxiliary furnace chamber 212 and be connected to the spacing adjustment mechanism 130; or one end of the first flow stabilizing hood 110 or one end of the second flow stabilizing hood 120 may pass through the furnace wall of the auxiliary furnace chamber 212 and be connected to the spacing adjustment mechanism 130, thereby achieving the adjustment of the spacing between the first flow stabilizing hood 110 and the second flow stabilizing hood 120. Of course, in other embodiments of the present disclosure, one end of the spacing adjustment mechanism 130 passes through the furnace wall of the auxiliary furnace chamber 212 and is connected to the first flow stabilizing hood 110 and/or the second flow stabilizing hood 120, and is not limited herein.

Preferably, the spacing adjustment mechanism 130 includes a spacing adjustment bracket 131 and a first driving mechanism 132. One end of the spacing adjustment bracket 131 is connected to the first flow stabilizing hood 110 and the second flow stabilizing hood 120, respectively; or the spacing adjustment bracket 131 is connected to one end of the first flow stabilizing hood or one end of the second flow stabilizing hood, and the first driving mechanism 132 is connected to the spacing adjustment bracket 131, for driving the spacing adjustment bracket 131 to move closer to or away from each other, so as to adjust the distance between the first flow stabilizing hood 110 and the second flow stabilizing hood 120.

The spacing adjustment bracket 131 can be arranged outside the auxiliary furnace chamber, one end of the first flow stabilizing hood 110 and/or the second flow stabilizing hood 120 passes through the furnace wall of the auxiliary furnace chamber and is connected to the spacing adjustment bracket. The driving mechanism 132 is connected to the spacing adjustment bracket 131, and the first driving mechanism drives the spacing adjustment bracket to move, so that the first flow stabilizing hood 110 and the second flow stabilizing hood 120 move up and down in the auxiliary furnace chamber 212, thereby controlling the spacing between the first flow stabilizing hood 110 and the second flow stabilizing hood 120, and further better controlling the flow direction and flow rate of the inert gas. As described in the above embodiment, the position of the first flow stabilizing hood 110 and the second flow stabilizing hood 120 in the auxiliary furnace chamber 212 can be adjusted by the position adjustment mechanism, so as to be adapted for growing crystal rods at different lengths, thereby improving the use flexibility of the crystal pulling furnace.

The flow stabilizing device 100 in the present disclosure adopts the flow stabilizing device 100 of the above embodiment. Since the structure and technical effects of the flow stabilizing device 100 have been described in detail in the above embodiments, other specific structures and effects of the flow stabilizing device can be referred to the flow stabilizing device 100 in the above embodiment, and will not be described herein.

The crystal pulling furnace 200 of the present disclosure is possible to reduce the swing of the monocrystalline silicon rod caused by the inert gas flow, to help the stable contact between the monocrystalline silicon rod and the molten liquid surface, to reduce the probability of monocrystalline growth dislocations, to improves the production efficiency of the monocrystalline silicon rod, to reduce the impurities 400 in the main furnace chamber 211 carried to the auxiliary furnace chamber 212 by turbulent flow, and to avoid the problems as pollution and erosion caused by the impurities 400 to the sidewalls of the crystal rods and thermal field components.

The method for regulating the inert gas flow according to the present disclosure is applied to the crystal pulling furnace 200. The regulating method includes: introducing the inert gas 300 into a main furnace chamber of the crystal pulling furnace 200 from an auxiliary furnace chamber 212 of the crystal pulling furnace 200, and regulating a flow direction of the inert gas 300 introducing into the auxiliary furnace chamber 212 of the crystal pulling 200.

As shown in FIGS. 4 and 5, the flow direction of the inert gas 300 passing into the auxiliary furnace chamber 212 of the crystal pulling furnace 200 is adjusted by providing the first flow stabilizing hood 110 and the second flow stabilizing hood 120 in the auxiliary furnace chamber 212 of the crystal pulling furnace 200.

Preferably, the inert gas 300 in the auxiliary furnace chamber 212 may be rectified by the first flow stabilizing hood 110 of the funnel as shown in FIG. 1c; and the rectified inert gas is uniformly distributed by the second flow stabilizing device 120 of inverted funnel.

Preferably, as shown in FIGS. 1e and 1g, the method for regulating the inert gas flow further includes rectifying the distributed inert gas 300 again, and distributing the rectified inert gas 300 again, to further improve the stabilizing effect of the gas flow. The appropriate flow stabilizing hood is selected according to the production needs of different needs.

Preferably, a flow direction and a flow rate of the inert gas can also be adjusted by adjusting a size of the steady flow interval.

Preferably, it further includes controlling a position of the inert gas flow where the inert gas flow is distributed in the auxiliary furnace chamber 212 to adapt for growth of crystal rods at different lengths.

Since the flow stabilizing method of the flow stabilizing device has been described in detail in the flow stabilizing device of the above embodiment, the method for regulating the steady flow of the inert gas in the present disclosure can be carried out by the flow stabilizing device. Therefore, the gas flow stabilizing method can be referred to the description of the above embodiment, and will not be described herein again.

The method for preparing the monocrystalline silicon according to an embodiment of the present disclosure, which is applied to a crystal pulling furnace 200 including a main furnace chamber 211 and an auxiliary furnace chamber 212, including:

step 1: melting polycrystalline silicon in the main furnace chamber 211 of the crystal pulling furnace 200;

step 2: contacting a seed crystal with the molten polycrystalline silicon; and step 3: introducing an inert gas 300 into the auxiliary furnace chamber of the crystal pulling furnace 200, and regulating the inert gas flow by the method of the above embodiments.

Preferably, the method further includes: adjusting a size of the steady flow interval formed between the rectifying and the distributing to adjust a flow direction and a flow rate of the inert gas flow to be introduced into a main furnace chamber, after the polycrystalline silicon has completely been melted, and when the seed crystal contacts with the molten polycrystalline silicone, and a growing crystal rod does not reach a bottom of the auxiliary furnace chamber.

Preferably, the method further includes controlling a position of the inert gas where the inert gas flow is distributed in the auxiliary furnace chamber to adapt for growth of crystal rods at different lengths.

Preferably, the preparing method further includes guiding the inert gas 300 through the reflector 213 provided in the main furnace chamber of the crystal pulling furnace when the inert gas is introduced into the main furnace chamber 211, so that the inert gas 300 flows toward the contact surface between the molten polycrystalline silicon and the seed crystal. Thus the inert gas 300 can be effectively drained to the contact surface between the molten liquid and the seed crystal, and thereby it is more conducive to the rapid growth of the crystal rods.

The method for preparing monocrystalline silicon according to the embodiment of the present disclosure adopts the method for regulating the inert gas flow in the above embodiments. Since the method for regulating the inert gas flow has been described in detail in the above embodiments, the details can be referred to the method in the above embodiments, and will not be described herein.

The method for manufacturing monocrystalline silicon according to embodiments of the present disclosure is possible to reduce the swing of the monocrystalline silicon rod caused by the inert gas flow, to help the stable contact between the monocrystalline silicon rod and the molten liquid surface, to reduce the probability of monocrystalline growth dislocations, to improves the production efficiency of the monocrystalline silicon rod, to reduce the impurities 400 in the main furnace chamber 211 carried to the auxiliary furnace chamber 212 by turbulent flow, and to avoid the problems as pollution and erosion caused by the impurities 400 to the sidewalls of the crystal rods and thermal field components.

The monocrystalline silicon according to the embodiment of the present disclosure is obtained by the method for preparing monocrystalline silicon as described in the above embodiments. The monocrystalline silicon according to the present disclosure can avoid dislocations and has a high purity.

Unless otherwise defined, technical terms or scientific terms used herein have the normal meaning commonly understood by one skilled in the art in the field of the present disclosure. The words "first", "second", and the like used in the present disclosure do not denote any order, quantity, or importance, but rather merely serves to distinguish different components. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

The above descriptions are preferred embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A method for regulating an inert gas flow in a crystal pulling furnace, comprising:
    introducing the inert gas into a main furnace chamber of the crystal pulling furnace from an auxiliary furnace chamber of the crystal pulling furnace;
    regulating a flow direction of the inert gas flow introduced into the auxiliary furnace chamber of the crystal pulling furnace in which at least two flow stabilizing hoods are installed; and
    adjusting a distance between adjacent two flow stabilizing hoods of the at least two flow stabilizing hoods by a spacing adjustment mechanism so that a steady flow interval of the inert gas is formed between the adjacent two flow stabilizing hoods.

2. The method of claim 1, further comprising:
    rectifying the inert gas flow in the auxiliary furnace chamber; and
    evenly distributing the inert gas flow after the rectifying.

3. The method of claim 2, further comprising:
    rectifying the inert gas flow again after the distributing; and
    distributing the inert gas flow again after the rectifying again.

4. The method of claim 1, wherein the method further comprises:
    adjusting a size of a steady inert gas flow interval formed between the rectifying and the distributing to adjust a flow direction and a flow rate of the inert gas flow to be introduced into the main furnace chamber.

5. The method of claim 4, further comprising:
    controlling a position of the inert gas flow where the inert gas flow is distributed in the auxiliary furnace chamber to adapt for growth of crystal rods at different lengths.

6. A method for preparing monocrystalline silicon, which is applied to a crystal pulling furnace comprising a main furnace chamber and an auxiliary furnace chamber, comprising:
    melting polycrystalline silicon in the main furnace chamber of the crystal pulling furnace;
    contacting a seed crystal with the molten polycrystalline silicon; and
    introducing an inert gas flow into the auxiliary furnace chamber of the crystal pulling furnace, and regulating the inert gas flow by the method of claim 1.

7. The method of claim 6, wherein the method further comprises:
    adjusting a size of the steady flow interval formed between the rectifying and the distributing to adjust a flow direction and a flow rate of the inert gas flow to be introduced into a main furnace chamber, after the polycrystalline silicon has completely been melted, and when the seed crystal contacts with the molten polycrystalline silicon and a growing crystal rod does not reach a bottom of the auxiliary furnace chamber.

8. The method of claim 7, wherein the method further comprises:
    controlling a position of the inert gas flow where the inert gas flow is distributed in the auxiliary furnace chamber to adapt for growth of crystal rods at different lengths.

9. The method of claim 6, wherein the method further comprises:
    guiding the inert gas flow by a reflector provided in the main furnace chamber of the crystal pulling furnace when the inert gas flow is introduced into the main furnace chamber, so that the inert gas flows toward a contact interface between the molten polycrystalline silicon and the seed crystal.

10. The method of claim 6, further comprising:
    rectifying the inert gas flow in the auxiliary furnace chamber; and
    evenly distributing the inert gas flow after the rectifying.

11. The method of claim 10, further comprising:
    rectifying the inert gas flow again after the distributing; and
    distributing the inert gas again after the rectifying again.

12. A method for regulating an inert gas flow in a crystal pulling furnace, comprising:
    introducing the inert gas into a main furnace chamber of the crystal pulling furnace from an auxiliary furnace chamber of the crystal pulling furnace; and
    regulating a flow direction of the inert gas flow introduced into the auxiliary furnace chamber of the crystal pulling furnace in which at least two flow stabilizing hoods are installed,
    wherein the at least two flow stabilizing hoods are all funnel-shaped flow stabilizing hoods with a wide mouth at one end and a narrow mouth at the other end, and adjacent two flow stabilizing hoods of the at least two flow stabilizing hoods are arranged so that their narrow mouths or their wide mouths are opposite with each other.

\* \* \* \* \*